United States Patent [19]

Greene et al.

[11] Patent Number: 4,513,308

[45] Date of Patent: Apr. 23, 1985

[54] P-N JUNCTION CONTROLLED FIELD EMITTER ARRAY CATHODE

[75] Inventors: Richard F. Greene, Bethesda, Md.; Henry F. Gray, Alexandria, Va.

[73] Assignee: The United States of America as represented by the Secretary of the Navy, Washington, D.C.

[21] Appl. No.: 421,766

[22] Filed: Sep. 23, 1982

[51] Int. Cl.[3] .................... H01L 29/06; H01L 29/34; H01L 27/12

[52] U.S. Cl. .................................... 357/55; 357/32; 357/52; 357/49; 313/309; 313/310; 313/366; 313/387

[58] Field of Search ...................... 357/32, 52, 55, 49; 313/366, 387, 309, 310

[56] References Cited

U.S. PATENT DOCUMENTS

| | | | |
|---|---|---|---|
| 2,105,166 | 9/1937 | Choyke et al. | 313/310 |
| 2,960,659 | 11/1960 | Burton | 330/65 |
| 3,581,151 | 5/1971 | Boyle et al. | 357/52 |
| 3,665,241 | 5/1972 | Spindt et al. | 313/309 |
| 3,716,740 | 2/1973 | Crowell et al. | 357/52 |
| 3,830,717 | 8/1974 | Singer et al. | 313/366 |
| 3,845,296 | 10/1974 | Schnitzler | 357/30 |
| 3,970,887 | 7/1976 | Smith et al. | 357/4 |
| 3,998,678 | 12/1976 | Fukase et al. | 313/309 |
| 4,008,412 | 2/1977 | Yuito et al. | 313/309 |
| 4,255,207 | 3/1981 | Nicolay | 357/50 |
| 4,303,930 | 12/1981 | Van Gorkom et al. | 357/52 |
| 4,307,507 | 12/1981 | Gray et al. | 313/309 |

*Primary Examiner*—Martin H. Edlow
*Assistant Examiner*—Jerome Jackson
*Attorney, Agent, or Firm*—Robert F. Beers; William T. Ellis; Charles E. Krueger

[57] ABSTRACT

A Field Emitter Array comprising a semiconductor substrate with an emitter surface formed thereon. A plurality of emitter pyramids is disposed on the emitter surface for emitting an electron current. The magnitude of the electron current emitted by each emitter pyramid $I_{max}$, is controlled by a reverse-biased p-n junction associated with each emitter pyramid where $I_{max}=j_{sat} X A_{p-n}$, $j_{sat}$ being the saturation current density and $A_{p-n}$ being the area of the reverse-biased p-n junction associated with each emitter pyramid. A grid, positively biased relative to the emitter surface and the emitter pyramids, is disposed above the emitter surface for creating an electric field that induces the emission of the electron current from the emitter tips.

16 Claims, 14 Drawing Figures

P-N JUNCTION CONTROLLED FIELD EMITTER ARRAY CATHODE

BACKGROUND OF THE INVENTION

The invention relates generally to cathodes for vacuum tubes and more particularly to field emitter array (FEA) cathodes for use with traveling wave tube (TWT) amplifiers or other electron devices.

An FEA generally comprises two closely spaced surfaces. The first, an emitter surface, has a large number of pyramid like shapes formed thereon. The second, a grid surface, is generally a metal sheet disposed above the emitter surface and electrically insulated therefrom. The grid generally has apertures disposed above the tips of the pyramids so that electrons emitted from the pyramid tips pass through the apertures when the grid is biased in a positive sense relative to the emitter pyramids.

The separation between the emitting surface and the grid is generally on the order of microns so that low grid voltages induce large emission currents. The emitted electrons may be accelerated and formed into a beam by standard techniques.

The FEA is now being utilized in many electron devices due to its inherent advantages over thermionic cathodes. Among these advantages are: (a) higher emission currents; (b) lower power requirements (c) less expensive fabrication and (e) easier interfacing with integrated circuits. However, despite the existence of the above-described advantages the utility of the FEA in microwave and millimeter amplifiers has been limited by two factors. First, the strong dependence of the emitted current on the emitter tip shape coupled with the difficulty of controlling tip shape results in poor point-to-point emission uniformity over the surface of the FEA. Second, residual gas absorbtion/desorption by the tips results in an emission current that is unstable and non-reproducible at a fixed grid voltage.

OBJECTS OF THE INVENTION

Accordingly. it is an object of the invention to provide an FEA with substantially uniform point-to-point electron emission current density over the surface of the FEA.

It is a further object of the invention to provide an FEA with a stable and reproducible emission current density for a fixed grid voltage.

SUMMARY OF THE INVENTION

The above and other objects are achieved in the present invention which comprises a semiconductor substrate with an emitter surface formed thereon. A plurality of nearly identical emitter pyramids are formed on the emitter surface for emitting electrons in the presence of an electric field. The maximum current emitted by each pyramid due to a given electric field will vary because of variations in the shape and surface conditions of the pyramid tips. In order to equalize the magnitude of the current emitted by every pyramid to a constant value, $I_{max}$ each emitter pyramid in the present invention has a reverse biased p-n junction associated therewith. The p-n junction is positioned so that the electron current emitted by its associated emitter pyramid must pass through the junction. Thus the magnitude of current emitted by the emitter pyramid is equal to the constant saturation current density of the reverse-biased p-n junction multiplied by the area of the junction. Since the FEA of the present invention is fabricated so that the saturation current density and the areas of all the p-n junctions are equal, the magnitudes of the electron currents emitted by each of the emitter pyramids are also equal.

The potential difference required to create the electric field at the emitter pyramids and to provide reverse-biasing of the p-n junctions is provided by biasing a conducting grid disposed above the emitter surface positively relative to the emitter pyramids and the substrate. The grid includes a plurality of apertures disposed to allow electron current to flow from the emitter pyramids.

BRIEF DESCRIPTION OF THE DRAWINGS

FIG. 3A–3H are cross-sectional views of intermediate structures formed during the fabrication of the embodiment depicted in FIG. 1.

DESCRIPTION OF THE PREFERRED EMBODIMENT

Briefly, the present invention comprises an emitter surface with a plurality of emitter pyramids formed with their bases thereon, and a conducting grid, supported by a dielectric layer disposed on the emitter surface, positioned above the emitter surface. The dielectric layer-grid structure has a plurality of apertures formed about the emitter pyramids. When the grid is biased positively relative to the emitter pyramids, electrons will be emitted through the pyramid tips. Although the pyramids fabricated as described below will be geometrically similar, the actual values of emission current will vary due to small variations in tip shape and tip surface conditions. Despite the above mentioned variations there is a maximum value of emission current that will be emitted by every pyramid when exposed to a sufficient positive grid voltage, $V_o$. The present invention provides a novel means for maintaining the total current flow emitted by each pyramid at a constant value, $I_{max}$, when the grid voltage is greater than $V_o$. This maintenance of constant total current flow into each pyramid is achieved by fabricating the FEA so that the total current flowing into each pyramid, $I_c$, must pass through a reverse-biased p-n junction of a given area uniquely associated with each pyramid. Thus $$I_{max}=I_c=j_{sat}\times A_{p\text{-}n}$$

where $j_{sat}$ is the saturation current through the reverse-biased p-n junction and $A_{p\text{-}n}$ is the area of the p-n junction associated with each of the pyramids.

As described below, $j_{sat}$ is constant over a large range of grid voltages. Thus an FEA built according to the inventive concepts described and claimed herein exhibits its point-to-point uniformity since the emission current at every tip is equal to $I_{max}$ and $I_{max}$ is a stable, reproducible function of the grid voltage.

Figure 1:
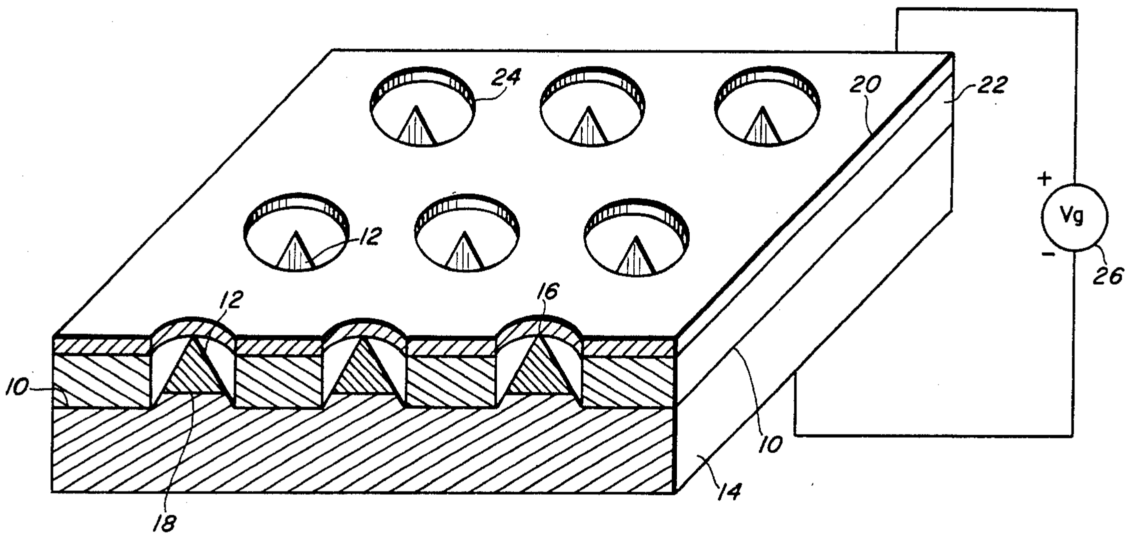
FIG. 1 is a perspective view of a first embodiment of the invention.

Referring now to the drawings wherein like reference numerals designate identical or corresponding parts throughout the several views, FIG. 1 is a perspective view of an embodiment of the present invention. An emitter surface 10, with a plurality of emitter pyramids 12 disposed thereon, is formed on a semiconductor substrate 14. Each pyramid 12, formed from the substrate 14 as described below, has a tip 16 through which electrons will be emitted in the presence of an electric field. A p-n junction 18 of a given area, $A_p$, formed in the substrate, is associated with each emitter pyramid 12 and disposed relative to the pyramid 12 so that all the current entering the pyramid 12 must pass through the p-n junction 18. In FIG. 1 a p-n junction 18 is disposed along the base of each emitting pyramid 12.

A metallic grid 20 is disposed above the emitter surface 12. The grid 20 is supported by a dielectric layer 22 deposited on the emitter surface 10. Both the grid 20 and the dielectric layer 22 have plurality of apertures 24 disposed around the emitter pyramids 12. A variable voltage supply 26 is electrically connected to the grid 20 and the semiconductor substrate 14.

Figure 2:
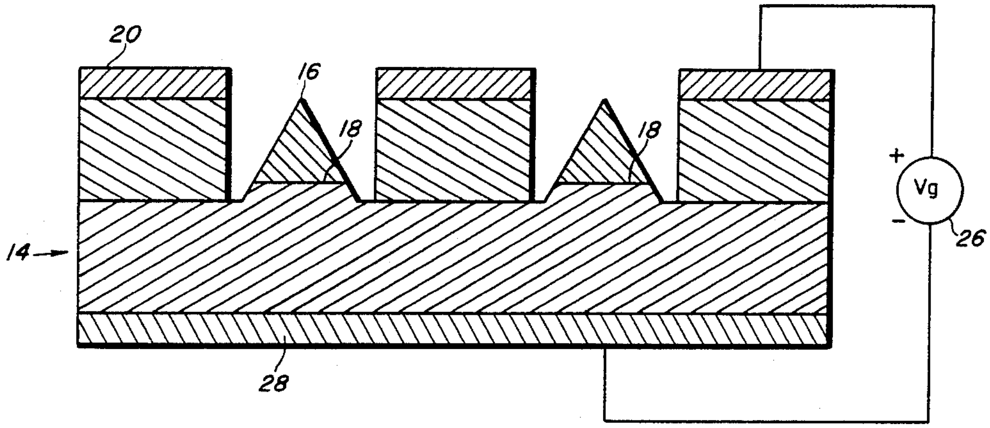
FIG. 2 is a cross-sectional view of the embodiment depicted in FIG. 1.

The description of the operation of the invention is facilitated by referring to FIG. 2, cross-sectional view of the embodiment depicted in FIG. 1. Referring now to FIG. 2, the grid 20 is biased positively with respect to the substrate. This biasing is achieved by electrically connecting the positive output of the variable voltage supply 26 to the grid 20 and the negative output to an electrode 28 disposed on the base of the substrate 14.

As the magnitude of the grid voltage, $V_g$, is increased the various pyramid tips 16 will begin emitting electron currents of differing magnitudes. Note that the p-n junction 18 at the base of each pyramid 12 is reverse-biased. Thus, as $V_g$ is increased so that $V_g > V_o$ the current density through the p-n junction 18 will assume a constant value $j_{sat}$, where $j_{sat}$ is the saturation current density of the junction.

The formulae set forth below are well-known in the art and are set forth, for example, in the book by S. M. Sze entitled *Physics of Semiconductor Devices*, Wiley-Interscience, New York, 1969. The static current density j in a planar abrupt p-n junction can be expressed in the diode form $$j = j_{sat}(e^{-eV_g/kT} - 1) \qquad (1)$$

where $V_g$ is the applied grid voltage (positive for reverse bias) and where $$j_{sat} = \left[ \frac{eD_n n_p}{\sqrt{D_n \tau_n}} + \frac{eD_p p_n}{\sqrt{D_p \tau_p}} \right] \qquad (2)$$

$n_p$ and $p_n$ are the equilibrium minority carrier densities (i.e. of electrons in the p-region and holes in the n-region, respectively), $eD_n kT = \mu n$ and $eD_p kT = \mu_p$ are the minority carrier electron and hole mobilities (e being the electronic charge, T the temperature and k Boltzmann's constant) and $\tau_n$ and $\tau_p$ are the minority carrier lifetimes.

Thus, at a few volts of reverse bias the current density becomes throttled at the saturation value $j_{sat}$ where it remains fixed until breakdown occurs, giving an operating range of perhaps 60 volts, over which j is nearly constant at the value $j_{sat}$.

As is well know in the art, $j_{sat}$ can be chosen over a range of perhaps 3–6 orders of magnitude by choice of the doping level of intentionally included recombination centers. The minority carrier doping level in silicon, $n_p$, can vary between the intrinsic level of $n_i = 2 \times 10^{10}$/cc down to $10^4$/cc, and similarly for $p_n$. Lifetimes, $\tau_n$ and $\tau_p$, can also be varied between $10^{-7}$ and $10^{-11}$ sec. Using a typical silicon mobility of $\mu_n = 1000$ cm$^2$/volt-sec., the range of $j_{sat}$ extends from $4 \times 10^{-2}$ amps/cm$^2$ to $4 \times 10^{-5}$ amps/cm$^2$.

The actual current, $I_{max}$, in a pyramid, in the structure of FIGS. 1 and 2 is then $$I_{max} = j_{sat} \times A_{p-n}$$

where $A_{p-n}$ is the area of the p-n junction in the base of the pyramid 12. The saturation current density of the FEA, $J_{FEA}$, is then given by:

$$J_{FEA} = j_{sat} \times \overline{A}_{p-n}$$

where $A_{p-n}$ is the ratio of the area of the p-n junctions 18 to the total area of the emitter surface.

Note that $J_{FEA}$ is uniform over the surface of the FEA since it is dependent on the area of the pyramid base instead of the shape and surface conditions of the pyrmiad tip. The area of the base may be precisely controlled by the fabrication techniques to be described below. Similarly, $J_{FEA}$ is a stable and reproducible function of $V_g$, since $j_{sat}$ is determined by the characteristics of the reverse-biased p-n junction.

Figure 3A:
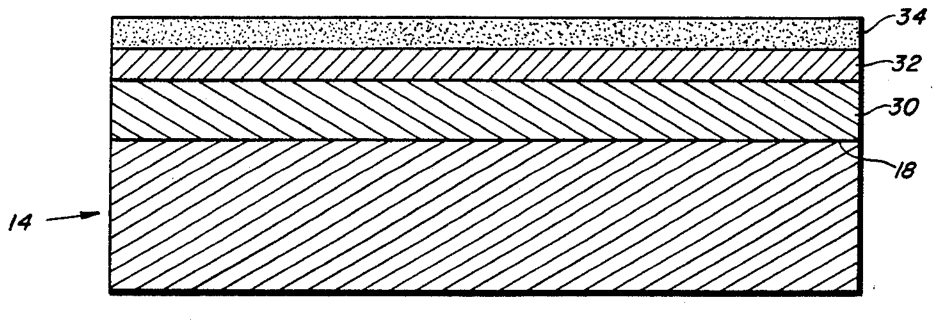

Referring now to FIG. 3A–3H, there are depicted exemplary steps for fabricating the embodiment of the invention illustrated in FIGS. 1 and 2. In FIG. 3A a generally planar, semiconductor substrate 14, which may be a single crystal wafer of silicon (Si), is depicted. A p-n junction 18 is formed in the silicon wafer at a predetermined distance before the upper surface utilizing techniques well-known in the art. Note that the layer between the junction and the upper surface is an n type-silicon 30.

The n-layer 30 is then oxidized to a depth of about one micron to produce an oxide layer 32 of $SiO_2$. Subsequent to the formation of the oxide layer, a thin photoresist layer 34 is coated over the oxide layer utilizing methods well-known in the art.

Figure 3B:
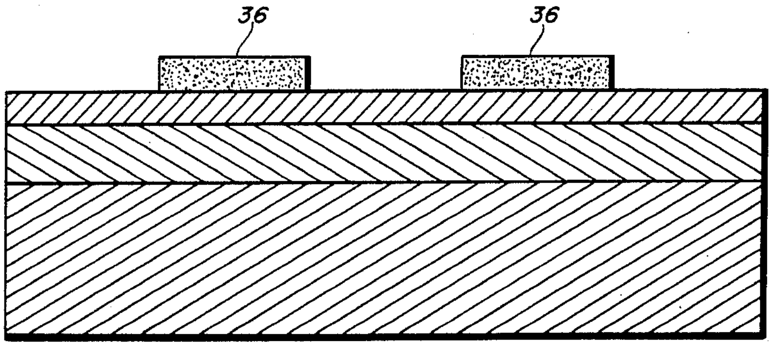

Subsequent to this processing the intermediate structure depicted in FIG. 3B is formed by exposing the photoresist surface to light projected through a suitable mask and then developing the photoresist layer so that a plurality of developed photoresist islands 36 result. These photoresist islands 36 being located at the points where emitter pyramids 12 are to be formed and are circular with a diameter of about two microns and a thickness on the order of one micron. The undeveloped sections of the photoresist layer are removed by standard techniques.

Figure 3C:
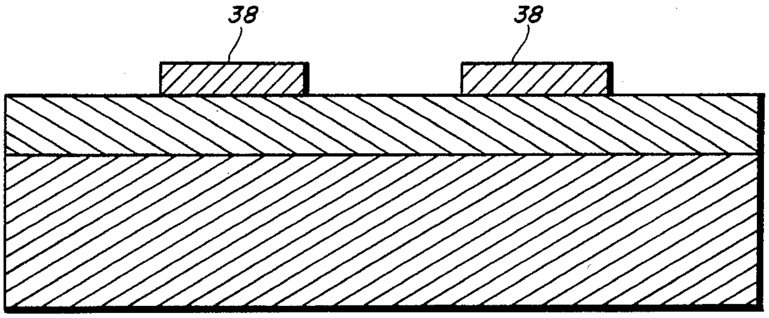

Next the intermediate structure depicted in FIG. 3C is formed by etching away those portions of the $SiO_2$ layer not protected by the photoresist islands 36 by standard techniques such as ion etching. The photoresist layer must be of the proper thickness and composition so that the differential etching rate between it and the $SiO_2$ layer is such that the $SiO_2$ layer is removed before the photoresist islands. Finally, the photoresist islands are removed so that a plurality of $SiO_2$ masking islands 38 disposed at the desired emitter pyramid positions remain.

Figure 3D:
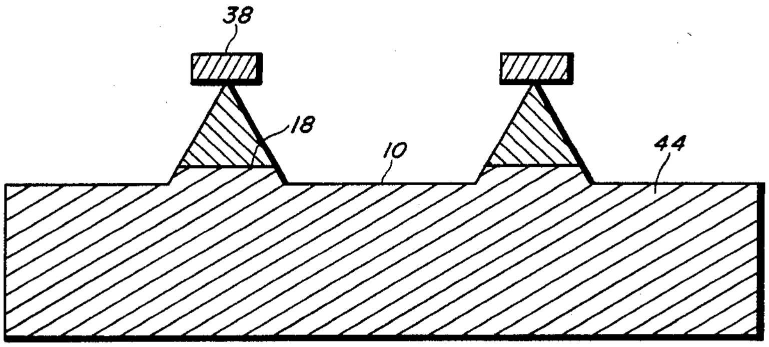

The next step in fabrication is to etch away most of the n-layer of the substrate, utilizing techniques to be described below, so that a plurality of emitting pyramids 12 disposed on an emitter surface 10 are formed as depicted in FIG. 3D. Note, that the emitter surface 10 and thus the bases of the emitter pyramids 12 are located in the p-layer 44 of the substrate. Therefore, the p-n junction 18 has been etched away except for those sections located in the emitter pyramid.

The structure of FIG. 3D is formed by exposing the surface of the Si substrate prepared as in FIG. 3C, having its upper surface parallel to the 100 crystal plane, to an orientation dependent etching (ODE) solution. Examples of ODE solutions include KOH based solutions (e.g. KOH, water, isoproponal) or pyrocatecholethylene diamene. The etching rate of the ODE solution is higher in the direction normal to the upper surface (the 100 plane) than in the directions of the 111 planes. Thus the 111 planes are control planes which form the sides of the emitter pyramids. Etching will be stopped just after the p-n junction between the emitter pyramids has been removed. Note that the $SiO_2$ masking islands 38 are supported by small necks of silicon at the pyramid tips. The emitting pyramids are integral with the underlying silicon substrate 14, i.e. they are formed from the same single crystal wafer.

The emitter pyramids may be formed by alternative methods described in, for example, U.S. Pat. No. 3,970,887. The resulting pyramids may have either planar side or round sides, i.e. the pyramid may be in the shape of a cone. However, the emitter surface and thus the base of the emitter pyramids must be positioned in the p-layer 44 of the substrate so that current passing into an emitter pyramid must pass through the p-n junction 18 positioned within the emitter pyramid.

Figure 3E:
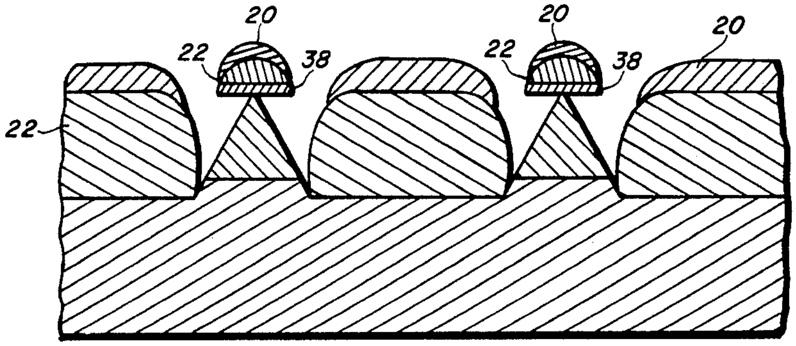

Referring now to FIG. 3E, the dielectric layer 22 and grid 20 are the formed by a self aligned fabrication technique. The emitting surface and emitter pyramids are coated with a dielectric layer 22 from 1 to 4 microns thick. The dielectric layer may be $SiO_2$ deposited by chemical vapor deposition (CVD) or may be other materials deposited by CVD, sputtering or other techniques. Note that the dielectric layer 22 is not deposited on the pyramids due to the shadow effect of the silicon dioxide masking islands 38, but is deposited on the upper surface of the silicon masking islands 38. A conducting grid 20 from 0.2 to 1.5 microns thick is now deposited on the dielectric layer by CVD, sputtering or other techniques. The grid may be metal (e.g. gold, molybdenum, aluminum, tungsten), semiconductors (e.g. polysilicon) or conducting polymers. The resulting intermediate structure is depicted in FIG. 3E.

Figure 3F:
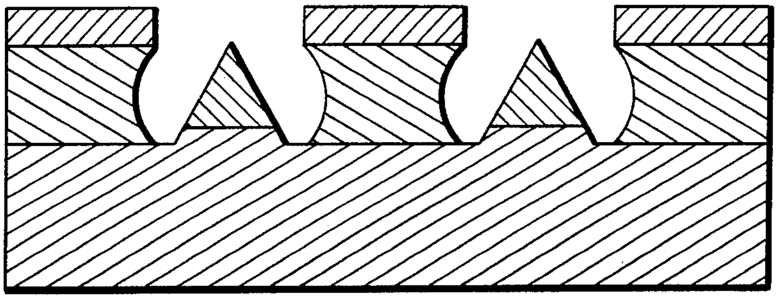

The final structure depicted in FIG. 3F, is formed by applying a suitable chemical etchant that will attack exposed $SiO_2$ surfaces but will have no effect on the silicon pyramid or the metal grid. The $SiO_2$ masking islands and the $SiO_2$ and metal grid material deposited thereon will be removed by the chemical etchant thereby exposing the tips of the pyramids. The pyramid tips may be sharpened to radii of from 100 Angstroms to 600 Angstroms by: (a) further ODE etching, (b) isotropic etching using standard liquid or plasma processes or (c) oxidizing the pyramid and removing the oxide.

Figure 4:
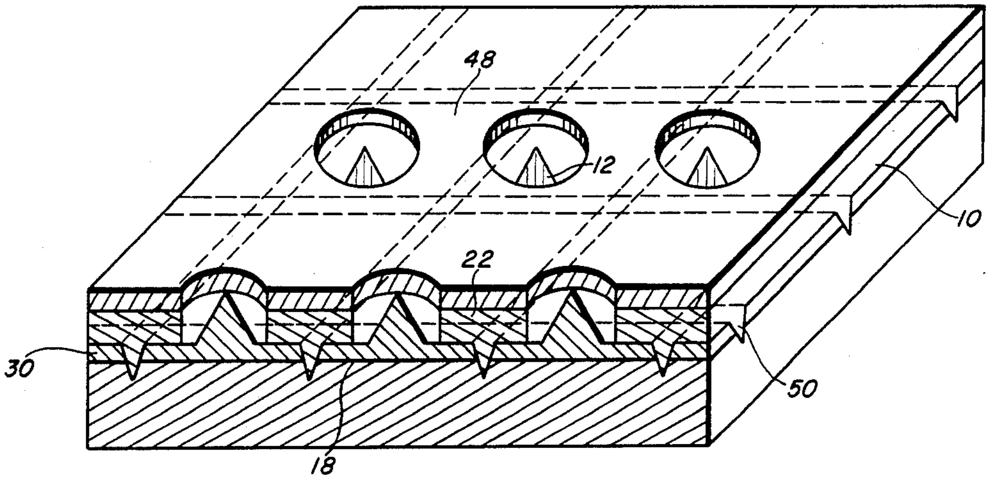
FIG. 4 is a perspective view of a second embodiment of the invention.

FIG. 4 is a perspective view of a second embodiment of invention. Referring now to FIG. 4, an emitter surface 10 is divided into isolation islands 48 by isolation groves 50 etched through the n-layer 30 into the p-layer 44. An emitter pyramid 12 is formed on each isolation island 48 so that the current flowing through the emitter pyramid tip must pass through the p-n junction 18 defined by the isolation island 48 associated with the emitter pyramid. Since the area of the p-n junctions formed by the isolation island 48 is precisely controlled, the magnitude of the current flow from each emitter tip will be equal to a constant value, $I_{max}$.

One advantage of the embodiment depicted in FIG. 4 is that $\bar{A}_{p-n}$, the ratio of the area of the p-n junctions to the total area of the emitter surface, is almost unity. Therefore the current density from the FEA will be high since $$j_{FEA}=j_{sat}\times\bar{A}_{P-N}$$

Figure 5A:
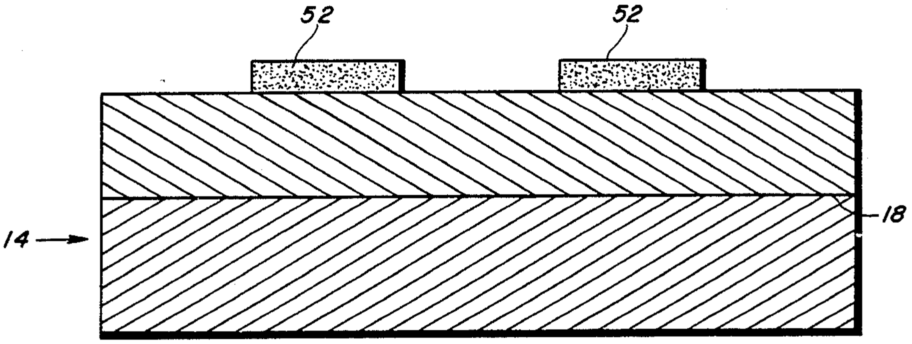
FIGS. 5A–5D are cross-sectional and top views of intermediate structures formed during the fabrication of the embodiment depicted in FIG. 4.

The steps for fabricating the embodiment of the invention depicted in FIG. 4 are illustrated in FIGS. 5A-5E. Referring now to FIG. 5A, a semiconductor substrate 14 with a p-n junction 18 formed therein has a two-dimensional pattern of silicon nitride ($Si_3N_4$) dots 52 deposited on its upper surface. The $Si_3N_4$ dots 52 are formed by first depositing a layer of $Si_3N_4$ and the using optical or e-beam lithography to form the dots therein. The dots are about 1 to 2 microns in diameter formed in a two dimensional 4 to 10 micron rectangular grid.

Subsequently a plurality of $SiO_2$ masking islands 54 with strip shaped openings between the $Si_3N_4$ dots is formed by the deposition and lithography steps described above. The resulting structure is depicted in FIGS. 5B and 5C, a cross-sectional and top view respectively.

Figure 5D:
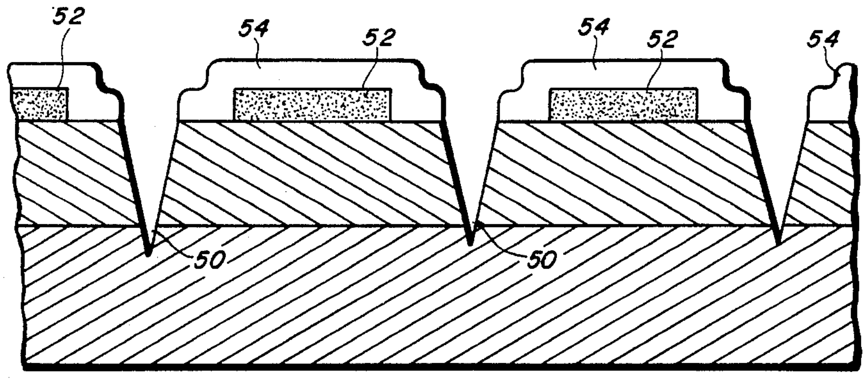

Next an ODE solution is utilized to etch V-shaped isolation grooves 50 extending through the p-n junction 18 thereby forming isolation islands 48 as depicted in FIG. 5D.

Note that the grooves forming the isolation islands need not be V-grooves formed by ODE techniques but may be fabricated by other lithographic-etch techniques well-known in the art.

Figure 5E:
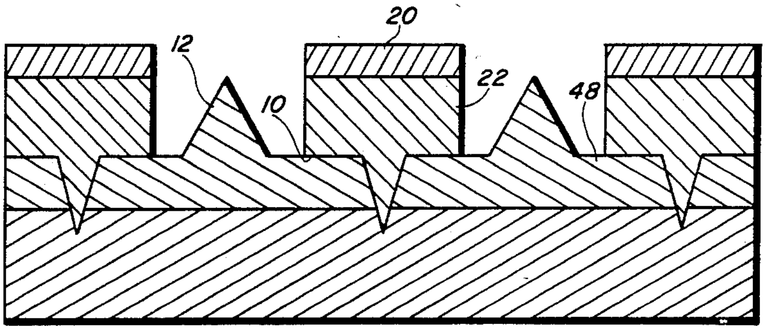
Figure 5B:
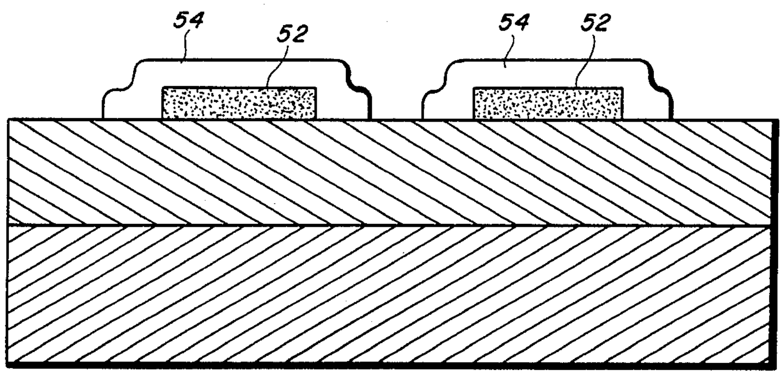
Figure 5C:
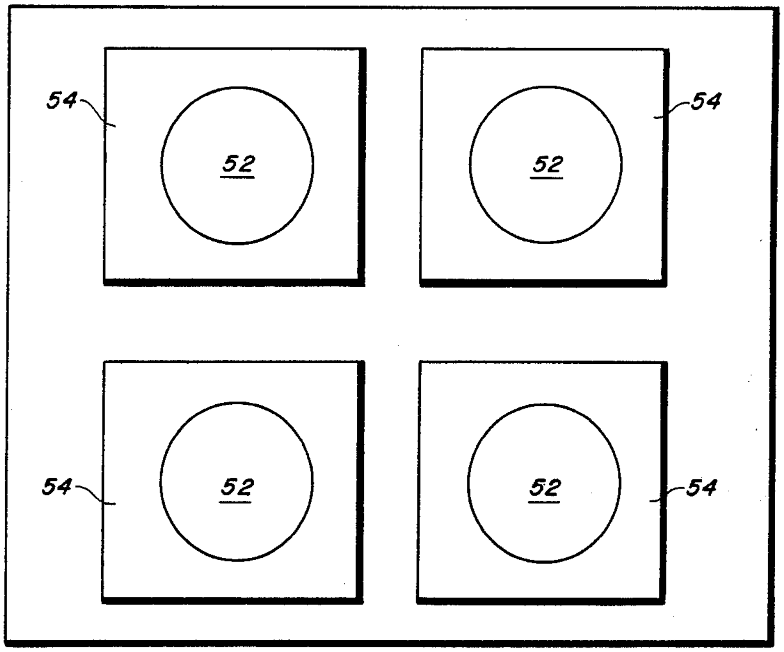

Finally the structure depicted in FIG. 5E is fabricated by forming an emitter pyramid 12 on each isolated section, a dielectric layer 22 and a grid 20 utilizing the self-aligned fabrication techniques described above in relation to FIGS. 3A-3F. Note that the emitter surface 10 formed on the isolation islands 48 must be disposed above the isolated p-n junctions 18.

An FEA constructed with in accordance the claims of the invention will feature several advantages over prior-art FEAs. First, array emission uniformity is improved since the value of the emission current from each emitter tip is controlled by standard p-n junction and integrated circuit fabrication technology in contrast to the dependence on emission tip shape and surface conditions in prior-art devices. Second, current stability and reproducibility are improved since current values now depend on the well-known stability of reverse-biased p-n junctions in contrast to the dependence on surface-barrier height and tip shape of prior art devices.

It will be understood that various changes in the details, material, steps and arrangements of parts, which have been herein described and illustrated in order to explain the nature of the invention, may be made by those of ordinary skill in the art within the principle and scope of the invention as expressed in the appended claims.

What is claimed and desired to be secured by Letters Patent of the Unites States is:

1. A field emitter array (FEA) comprising:

a semiconductor substrate, an emitter surface formed on said substrate;

a plurality of field emitter sites, with each field emitter site including an emitter pyramid, with a tip, sides, and a base for emitting electrons in the presence of an electric field, wherein the base of said emitter pyramid is disposed upon said emitter surface, said emitter site also including a permanent reverse-biased p-n junction, where said junction is the boundary between a p-type layer and an n-type layer of semiconductor material, wherein said p-n junction is positioned relative to said emitter pyramid so that an electron current flowing from said substrate into said emitter pyramid must traverse said p-n junction and wherein said p-n junction is oriented so that the n-layer is disposed between said junction and the tip of said emitter pyramid and is isolated from all other emitter pyramid n-layers, said p-n junction acting to limit the magnitude of the current density flowing therethrough to $j_{sat}$, where $j_{sat}$ is the saturation current density of said p-n junction in reverse bias; and a grid, positioned above said emitter surface, for inducing the emission of electron current from said emitter pyramid where said grid is positively biased relative to said emitter pyramid with a bias voltage sufficient to cause said p-n junction to operate in reverse-biased saturation..

2. The FEA recited in claim 1, wherein all of said p-n junctions have equal area; and further comprising means for biasing said grid relative to said emitter pyramid with a reverse bias sufficient to cause said p-n junction to operate in reverse-biased saturation.

3. The FEA recited in claim 2, wherein said p-n junctions are disposed at the base of said pyramids.

4. The FEA recited in claim 3 wherein:

said substrate is fabricated from a single-crystal silicon wafer and wherein:

said emitter surface is a planar surface oriented parallel to the 100 plane of said silicon substrate.

5. The FEA recited in claim 4 wherein:

the sides of said emitter pyramid are substantially parallel to the 111 planes of said silcon substrate.

6. The FEA recited in claim 5 wherein:

said emitter pyramid is integral with said silicon substrate.

7. The FEA recited in claim 6 wherein:

said p-n junction is substantially parallel to the 100 plane of said silicon substrate.

8. The FEA recited in claim 7 wherein:

said p-n junction is disposed within said emitter pyramid.

9. The FEA recited in claim 8 wherein:

the radii of the tip of said emitter pyramid is in the range of about 100 Angstroms to about 600 Angstroms.

10. The FEA recited in claim 9 wherein:

the thickness of said grid is in the range of about 0.2 microns to about 1.5 microns.

11. An FEA comprising:

a semiconductor substrate;

an emitter surface formed on said substrate;

a planar, permanent reverse-biased p-n junction disposed within said substrate parallel to said emitter surface, where said p-n junction is the boundary between a p-type layer and an n-type layer of semiconductor material, wherein said n-layer is disposed between said junction and said emitter surface and is isolated from all other emitter pyramid n-layers, said p-n junction for limiting the magnitude of the current density flowing there-through to $j_{sat}$, where $j_{sat}$ is saturation current density of the reverse-biased junction;

a plurality of isolation grooves formed in said emitter surface, wherein the bottom of said grooves is below said p-n junction;

a plurality of isolation islands formed on said substrate, wherein each isolation island is circumscribed by said isolation grooves and wherein the area of each isolation island is substantially equal to a constant value, $A_{p-n}$;

a plurality of emitter pyramids, each with a tip, sides, and a base, formed on said emitter surface wherein only one emitter pyramid is disposed on each isolation island so that the magnitude of the current emitted through the tip of each of said emitter pyramid is equal to:

$$I = j_{sat} \times A_{p-n}$$

a grid, positioned above said emitter surface, for inducing the emission of electron current from the tips of said emitter pyramids where said grid is positively biased relative to said emitter pyramids with a bias sufficient to cause said p-n junction to operate in reverse-biased saturation.

12. The FEA recited in claim 11 wherein:

said substrate is fabricated from a single crystal silcon wafer and wherein:

said emitter surface is a planar surface oriented parallel to the 100 plane of said silicon substrate.

13. The FEA recited in claim 12 wherein:

the side of said emitter pyramids are substantially parallel to the 111 planes of said substrate.

14. The FEA recited in claim 13 wherein:

said emitter pyramids are integral with said silicon substrate.

15. An FEA comprising:

a substrate formed from a single crystal silicon wafer;

a planar emitter surface formed on said substrate where said emitter surface is parallel to the 100 plane of said substrate;

a plurality of emitter pyramids formed on said emitter surface for emitting an electron current, each of said emitter pyramids including a p-type layer and an n-type layer with a planar reverse-biased p-n junction disposed therebetween, wherein said n-layer is isolated from all other emitter pyramid n-layers, said p-n junction being disposed parallel to said emitter surface and completely spanning the cross-section of the emitter pyramid so that an electron current flowing from the substrate to the tip must pass through the reverse-biased p-n junction and so that the magnitude of said electron current is equal to the saturation current density of said p-n junction multiplied by the area of said p-n junction; and a grid, disposed above the emitter surface, biased positively relative to said emitter pyramids with a bias voltage sufficient to cause said p-n junction to operate in reverse-biased saturation, said grid for inducing the emission of electron current from said emitter pyramids.

16. A method for providing a uniform, reproducible electron current from an FEA of the type with a plurality of emitter pyramids disposed on an emitter surface, with each emitter pyramid-emitter surface combination including a p-n junction formed for an n-type layer and a p-type layer of semiconductor material so that electron current flowing into said pyramid from said emitter surface must traverse said p-n junction, and wherein said p-n junction is oriented so that the n-layer is disposed between said junction and the tip of said emitter pyramid and is isolated from all other emitter pyramid n-layers, with all of said p-n junctions having an equal area, and including a conducting grid disposed above said plurality of emitter pyramids, said method comprising the steps of:

biasing said conducting grid positively relative to the emitter pyramids so that an electron current is emitted by said emitter pyramids; and reverse-biasing said p-n junctions with a bias voltage sufficient to cause said p-n junctions to operate in reverse-bias saturation, so that the electron current emitted by each emitter pyramid must pass through the p-n junction associated therewith thereby limiting the magnitude of the electron current, $I_c$, emitted by each emitter pyramid to $$I_c = j_{sat} \times A_{p\text{-}n},$$

where $j_{sat}$ is the saturation current density and $A_{p\text{-}n}$ is the area of each reverse-biased p-n junction.

* * * * *